United States Patent [19]

Klug et al.

[11] 4,144,402

[45] Mar. 13, 1979

[54] POWER SUPPLY WITH REPLACEABLE HIGH-VOLTAGE BUSHING

[75] Inventors: Herbert H. Klug; Albert P. Staszak, both of Ft. Wayne, Ind.

[73] Assignee: Litton Systems, Inc., Beverly Hills, Calif.

[21] Appl. No.: 823,507

[22] Filed: Aug. 10, 1977

[51] Int. Cl.[2] .................... H05K 5/00

[52] U.S. Cl. .................... 174/52 PE; 174/152 R; 337/202

[58] Field of Search .................... 174/52 PE, 18, 152 R; 336/96, 90; 337/202

[56] References Cited

U.S. PATENT DOCUMENTS

| | | | |
|---|---|---|---|
| 2,547,649 | 4/1951 | Marsh | 336/96 X |
| 3,054,975 | 9/1962 | Barr | 174/18 X |
| 3,153,114 | 10/1964 | Lindway et al. | 174/18 |
| 3,348,180 | 10/1967 | Leonard et al. | 174/18 X |

OTHER PUBLICATIONS

Triad 1977–1978 Catalog - p. 24 - Triad Utrad Distributor Services, Huntington, Indiana.

*Primary Examiner*—J. V. Truhe
*Assistant Examiner*—D. A. Tone
*Attorney, Agent, or Firm*—Robert A. Seldon; Ronald M. Goldman

[57] ABSTRACT

A novel housing structure for a high voltage power supply results in an easily replaceable electrical high voltage bushing. In this an elongated electrode is attached at an end to a support member and extends through an opening in a boundary plate, which is spaced from and supports said support member, and a hollow elongated electrical insulator, the "bushing," ensleeves said electrode and extends through said boundary plate opening to said insulating support means. A film coating is provided on the electrode and a like film coating is provided on the elongated insulator. The voids within the housing are filled with conventional "potting" material. The film coatings are moisture impervious to serve as moisture barriers and are indissoluble in, essentially, and nonadhesive with the potting material to allow detachment of the bushing.

7 Claims, 2 Drawing Figures

POWER SUPPLY WITH REPLACEABLE HIGH-VOLTAGE BUSHING

BACKGROUND OF THE INVENTION

Our invention relates to high voltage terminations and, more particularly, to an improved terminal and bushing construction for certain high voltage power supplies.

Electrical power supply apparatus produce electrical voltages on the order of 10–15 kilo volts at power levels of 5–25 watts for supplying the high voltage electrical requirements of electronic equipment, such as photostatic copiers and electrostatic air cleaners. Typically, the electrical circuitry of the power supply apparatus, which raises the ordinary line voltages, such as 120 volts, 60 cycle AC, to the aforementioned voltage levels, is encased in a metal housing or "can" and any voids within the housing cavity are filled with a "potting" material, such as electrical grade pitch, which serves to exclude moisture and conduct heat from the encased circuitry to the housing walls. The high voltage output of the encased circuitry is coupled by an electrical lead to an elongated electrical terminal or electrode, as variously termed. The electrode physically extends through a housing wall supported and insulated by an electrical insulator, often referred to as a high voltage bushing or, simply, bushing. The high voltage for application to the electronic equipment is taken by connection to that electrode.

The electrical insulator and electrode construction of typical power supply units with which we are familiar is either a unitary structure in which the electrode is molded within the insulator or one which becomes a unitary structure once the electrode is encased in the insulating bushing in a subsequent assembly operation. With either type, rubber glands or rubber washers are incorporated to serve as a moisture barrier at the interface between the electrode-bushing assembly and the encased electrical circuitry. Additionally, the insulator bushing typically is of a coated porcelain, ceramic or glass material which, possessing a higher electric strength than air, prevents current leakage or discharge between the electrode and the metal enclosure which is usually at ground potential.

Occasionally, a glass bushing breaks or cracks and its ability to maintain a high degree of electrical insulation between the electrode and the housing is thereby substantially reduced. And in the case of a coated porcelain bushing, minute pinholes in the glazed coating may allow moisture absorption, thus rendering the insulator useless and requires replacement. Inasmuch as the bottom side of the insulator and electrode are located within and effectively bonds to hardened potting material in those units with which we are familiar, replacement of the high-voltage bushing and reconditioning of the power supply unit at the factory is difficult and repair of those units in the field is almost impossible from an economic standpoint. There exist also, structural arrangements which incorporate a metal-to-metal seal, such as solder, at the interface of the housing and bushing or of the electrode and the bushing or of both kinds which makes bushing replacement even less practical than in the preceding example.

The principal purpose of our invention is to provide a novel construction for such high voltage power supply units that allows quick, easy and effective field replacement of the high voltage bushing. A related purpose of the invention is to ensure that the bushing does not effectively bond to the potting material.

SUMMARY OF THE INVENTION

The invention is characterized by a housing defining a cavity, which encloses the electrical components of a high voltage generator, an opening in the cavity, and a platelike closure member for closing such opening. An insulating support member located under the closure member is supported from the closure member in spaced relation thereto and is received within the cavity. An elongated electrical conductor extends from the underlying support member through an opening in the closure member to a distance beyond the housing walls, said electrode being adapted for connection to the encased high voltage circuitry; and an elongated hollow electrical insulator member is fitted on said electrode and extends from outside said closure member to said support member within the cavity. A film coating is provided on the insulator member surface portion located within the cavity and a film coating is provided on the electrode. The voids within the cavity are filled with an electrical potting material. The film coating is of a material that is indissoluble in the potting material and is nonadhesive therewith serving as a moisture barrier and permitting said electrical insulator member to be detached and withdrawn from said cavity and easily replaced.

The foregoing advantages and objects of our invention together with the structure characteristic thereof is better understood by making reference to the detailed description of a preferred embodiment of the invention, which follows, considered together with the figures of the drawings.

DESCRIPTION OF THE PREFERRED EMBODIMENTS

Figure 1:
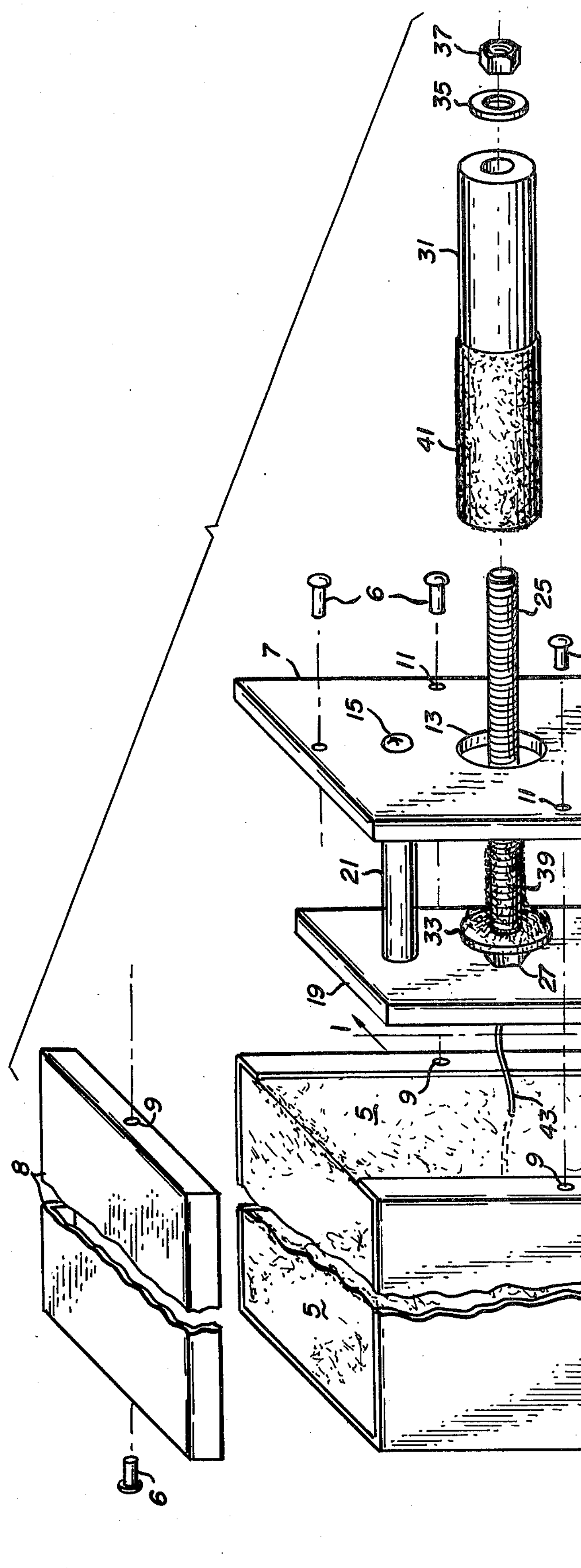
FIG. 1 illustrates a partial exploded perspective view of the invention.
Figure 1:
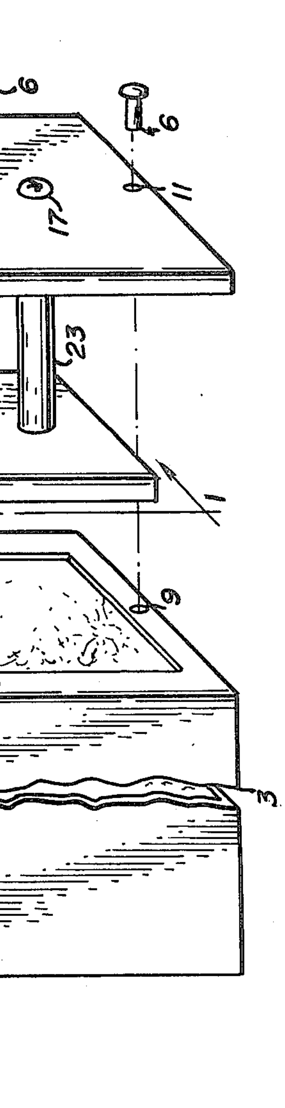

Reference is now made to a preferred embodiment of the invention illustrated in an exploded perspective view in FIG. 1. A six sided metal housing, 3, partially illustrated, encases standard electrical high voltage generating circuits, not visible, encased in electrical potting material, 5, suitably electrical grade pitch, visible from an open side of the housing. A closure member, metal plate 7, is a cover for the opening and is fastened in place to the housing by pop-rivets 6, which extend into axially aligned holes 9 and 11, of the housing and cover, respectively. A top wall or lid 8 is shown in uplifted position and serves to cover a second open side to the container. Plate 7 also contains a circular passage 13. And a pair of small spaced openings are also provided through which bolts 15 and 17 extend. A second platelike member 19 of an electrically insulative material, such as ceramic, is located underlying closure plate 7. Plate 19 is supported by closure plate 7 at a desired spacing by bolts 15 and 17 and corresponding nuts, not visible, which appear on the underside of plate 19, and the spacing between the plates is maintained by the hollow cylindrical spacers 21 and 23, preferably electrical insulators, coaxially mounted on the respective bolts. An electrode 25 is formed of a threaded bolt of electrically conductive material, such as copper. The electrode is supported at one end by the plate 19 by the simple expedient of a fastened nut 27, and the cap of the bolt, not visible in this figure, to provide frictional clamping to the second plate, and plate 19 thus serves also as a support member. As is apparent, the length of electrode 25 is greater than the spacing between plates 7 and 19 and protrudes beyond the surface of plate 7 by any amount desired.

A hollow elongated cylindrical element 31 of high dielectric electrically insulative material, suitably of a glass or a ceramic material, forms the high voltage electrical insulator or "bushing." The bushing has an inner passage greater in diameter than the diameter of electrode 25 to enable the bushing to be inserted over and ensleeve a portion of the electrode. The outer diameter of the bushing is small enough to allow the outer surface to clear through passage 13 in plate 7. Suitably, a pair of washers 33 and 35 are mounted at opposite ends of the insulator and a nut 37 is fitted onto the end of element 25 so as to retain the stand-off 31 in place supported essentially by electrode 25. Other forms of retaining means for the bushing may obviously be substituted. A film coating is applied to the lower end of electrode 25, represented as 39 in the figure, preferably covering the entire portion of that element located in between plates 7 and 19. Additionally the portion of the voltage bushing 31 underlying plate 7 is covered with the film coating 41. The film coating material is suitably of silicone grease, a well-known sealant substance, such as G.E. Silicone Compound G635, that is brushed on and remains soft. It is impervious to moisture and is indissoluble in the potting material 5 and does not permanently adhere or bond thereto, hence may be described as nonadhesive with respect to such potting material, and is of course an electrical insulator with a high dielectric strength. For completeness, an electrical lead wire 43 is illustrated which is connected to the element 25 and to the electrical components, not visible, of the power supply. The mechanical assembly of the elements is generally self-evident from the figure and need not be described in great detail.

The thin film coatings 39 and 41 are applied to the electrode 25 and bushing 31 and the boundary plate 7 with the supported insulator plate 19 to which electrode 25 is attached is fastened to the housing with rivets 6. The bushing is then inserted in place over and encasing electrode 25 and washer 35 and nut 37 are assembled to the electrode to retain the bushing in place. The potting material in its fluid uncured state is then poured into the housing through the remaining open side or equivalent opening to fill the voids. The top side or lid 8 is then fastened in place, suitably with pop rivets. Thereafter the potting material is cured in any known manner, including self-curing with time, and hardens to form a solid mass.

Figure 2:
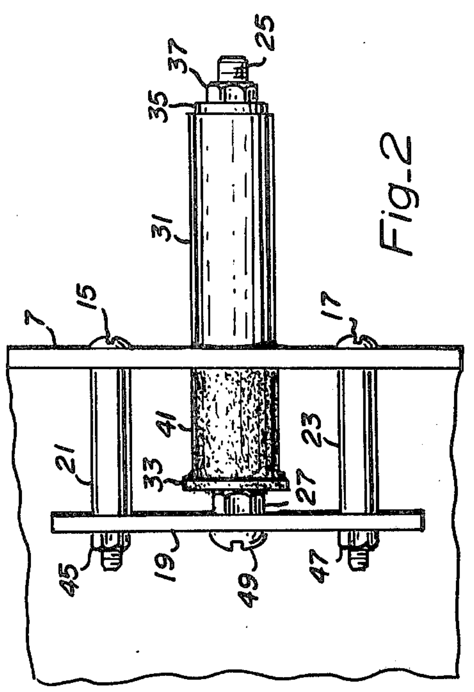
FIG. 2 illustrates a side elevation view of a partial section view of FIG. 1 taken along the lines 1—1.

For completeness of understanding, a partial side elevation view of the pertinent elements in assembled relation is provided in FIG. 2, a view taken along the lines 1—1 of FIG. 1 but in which electrical lead 43 and the potting material are omitted. For convenience, elements identified in FIG. 1 by a numeral are identified by the same numeral in this figure. In this view, the nuts 45 and 47 fastened to the bolts 15 and 17, respectively, as well as the cap 49 of electrode 25, are visible. The threaded exposed end of electrode 25 may serve as a high voltage terminal. In the operation of this power supply, an AC line voltage is supplied via leads, not illustrated, into the enclosed electrical components and circuitry which converts such voltages to the higher voltages required. The output of such components is coupled by electrical leads to electrode 25, such as by contact or electrical lead connected to the cap 49. The threaded exposed end of electrode 25 serves as an electrical terminal by means of which the high voltage output is connected to other equipment. Should it become desirable at some time or other to replace the bushing insulator 31, the replacement is a simple matter. The nut 37 is removed and the bushing 31 is withdrawn axially exposing a cast impression in the hardened potting material. A new bushing of identical geometry to the old bushing having an end coated with the film material is simply inserted over element 25 and fastened in place by washer 35 and nut 37. The new bushing will, of course, have essentially the same dimensions as the hole and thus fits into place within the void left in the solidified potting compound. The film coating being essentially nonadhesive with the potting compound permits easy withdrawal of bushing 31. Thus a prime advantage of the invention is accomplished; the film coating serves the twofold purpose of releasing agent and moisture barrier, hence removing the need for rubber glands or washers acting as moisture barriers.

As is evident to the reader skilled in the art, many variations of detail in the invention now become apparent. For example, plate 19 may be made of metal and the spacer and bolts 15 may be made of electrical insulating material; alternatively, other means of attachment may be made as a substitute for the bolts 15 and 17 and spacers 21 and 23 illustrated; and other geometries for the support means 19 may be substituted. Thus it is believed that the foregoing description of a preferred embodiment of the invention is sufficient in detail to enable one skilled in the art to practice the invention without undue experimentation. However, it is expressly understood that the invention is not limited to the details presented for that purpose in that many variations of the invention, some of which were previously described, as well as substitutions of equivalent elements or even improvements, all of which embody the invention, become apparent to those skilled in the art upon reading this specification. It is therefore respectfully requested that the invention is to be broadly construed within the full spirit and scope of the appended claims.

What is claimed is:

1. An improved construction for a high voltage power supply comprising a container having walls defining a cavity adapted to receive electrical high voltage circuitry and an opening;

a closure member for closing said opening and containing a passage between the front and back surfaces thereof;

a support member located in said cavity, said support member being spaced from and supported by and electrically insulated from said closure member;

an elongated electrode, said electrode being coupled at one end to said support member and extending through said passage in said closure member, said electrode being of a length greater than the spacing between said closure member and said support member;

an elongated hollow cylinder of electrically insulative material of a length greater than said spacing between said closure member and said support member and lesser in length than said electrode, said cylinder being coaxially mounted on said electrode and extending through said passage approximately to said support member;

dielectric film coating means at least covering the portion of said electrode and said cylinder underlying said closure member for providing an insulative moisture barrier between the electrode and the inner walls of said cylinder and between the outer surface of said cylinder and said passage in said closure member, and electrical potting material filling the voids within said cavity;

said film coating means being impervious to moisture and being essentially nonadhesive with said potting material so as to allow removal and reinsertion of said elongated insulator cylinder through said passage;

said electrode, cylinder and film coating means functioning together physically to prevent moisture from entering said cavity via said passage in said closure member.

2. The invention as defined in claim 1 wherein said potting material comprises electrical grade pitch and said film coating comprises a silicone grease material.

3. The invention as defined in claim 1 further comprising retaining means coupled to said electrode for retaining said insulator cylinder in a given position on said electrode.

4. The invention as defined in claim 3 wherein said electrode comprises a threaded bolt and wherein said retaining means comprises a nut for mounting through on the end of said bolt in abutting relation with an end of said insulator cylinder.

5. The invention as defined in claim 1 wherein said support member comprises an electrically insulative material and wherein said container and said closure member each comprise an electrically conductive metal material.

6. An improved construction for a high voltage power supply comprising a metal container having walls defining a cavity for receiving electrical high voltage circuitry and having an opening:

a metal boundary plate for covering said opening;

a support plate of dielectric insulator material spaced a predetermined distance from said boundary plate;

bolt means and spacer means for spacing said boundary and support plates a predetermined distance, said bolt means and spacer means extending between and supporting said boundary and support plates together;

said boundary plate containing a circular opening;

an elongated electrical conductor means, providing an electrode adapted to be connected to the high voltage section of said power supply;

means coupling said support plate to said conductor means for supporting said conductor means in a position extending through said opening in said boundary plate;

an elongated hollow cylindrical member of electrical insulator material extending approximately from said support plate through said opening in said boundary plate to a predetermined distance from the end of said conductor means, said insulating cylinder being of a close fit with said opening in said boundary plate;

film coating means of electrically insulative material covering at least a portion of said electrode and film coating means covering at least the portion of said elongated cylindrical member in the portion between said boundary plate and said support plate;

each of said film coating means and potting material filling the voids within said enclosure and behind said boundary plate, said film coating means being essentially indissoluble in said potting material and nonadhesive therewith for providing a moisture barrier therebetween while permitting detachment of said elongated insulator means;

and means for retaining said insulator in position on said elongated electrode to prevent relative movement therebetween.

7. The invention as defined in claim 6 wherein said conductor means comprises a threaded boltlike member having a cap at an end.

* * * * *